(12) United States Patent
Hasper (10) Patent No.: US 6,907,362 B2
(45) Date of Patent: Jun. 14, 2005

(54) RESOURCE CONSUMPTION CALCULATOR

(75) Inventor: Albert Hasper, Meppel (NL)

(73) Assignee: ASM International N.V., Bilthoven (NL)

(*) Notice: Subject to any disclaimer, the term of this patent is extended or adjusted under 35 U.S.C. 154(b) by 0 days.

(21) Appl. No.: 10/829,023

(22) Filed: Apr. 20, 2004

(65) Prior Publication Data

US 2004/0199335 A1 Oct. 7, 2004

Related U.S. Application Data

(63) Continuation of application No. 09/893,176, filed on Jun. 27, 2001, now Pat. No. 6,782,343.
(60) Provisional application No. 60/272,393, filed on Feb. 28, 2001.

(51) Int. Cl.$^7$ ................................ G06F 19/00
(52) U.S. Cl. ...................... 702/60; 702/22; 702/30; 702/189; 700/111
(58) Field of Search ..................... 700/121, 169, 700/291, 19–21, 50, 9, 108, 51, 80, 83, 89, 100, 109–111; 438/5, 10, 14, 17; 716/2, 4; 702/126, 130, 132–134, 138, 183, 184, 189, 22–24, 27, 28, 30–36, 40, 56, 57, 60, 64, 65, 81–84, 99, 104, 113–119, 124, 136

(56) References Cited

U.S. PATENT DOCUMENTS

| | | | |
|---|---|---|---|
| 5,153,837 A | | 10/1992 | Shaffer et al. |
| 5,586,039 A | * | 12/1996 | Hirsch et al. ................. 700/95 |
| 5,586,059 A | * | 12/1996 | Oshelski et al. .............. 702/84 |
| 5,757,673 A | * | 5/1998 | Osheiski et al. ............ 702/182 |
| 5,801,961 A | * | 9/1998 | Moore et al. ................ 700/286 |
| 5,925,212 A | * | 7/1999 | Rice et al. ............. 156/345.27 |
| 6,228,563 B1 | * | 5/2001 | Starov et al. ................ 430/327 |
| 6,368,975 B1 | * | 4/2002 | Balasubramhanya et al. ........................... 438/706 |
| 6,408,220 B1 | * | 6/2002 | Nulman ....................... 700/121 |
| 6,496,200 B1 | * | 12/2002 | Snibbe et al. ................ 345/701 |
| 2001/0014003 A1 | * | 8/2001 | Dible .......................... 361/234 |
| 2001/0039462 A1 | * | 11/2001 | Mendez et al. ............... 700/45 |
| 2002/0055801 A1 | * | 5/2002 | Reiss et al. .................. 700/111 |
| 2002/0072162 A1 | * | 6/2002 | Dor et al. .................... 438/200 |
| 2002/0156548 A1 | * | 10/2002 | Arackaparambil et al. .. 700/108 |

FOREIGN PATENT DOCUMENTS

WO    WO 01/46761 A2    6/2001

\* cited by examiner

*Primary Examiner*—Carol S. W. Tsai
(74) *Attorney, Agent, or Firm*—Knobbe Martens Olson & Bear LLP (57) ABSTRACT

A process tool controller of a semiconductor processing tool is provided with software that enables collecting, monitoring and logging information regarding the tool's consumption. Data is collected from the devices used for control of process conditions via the analog and digital inputs and outputs of the process tool controller. Consequently, the devices for controlling the process conditions have the additional function of measuring the tool's consumption. In this way the information regarding the tool's consumption is completely collected on board of the process tool. The parameters to be monitored and reported can be configured by the user, with use of a configuration editor, resulting in optimum flexibility of the system. In the illustrated embodiment, the user interface of the consumption monitoring and logging software is integrated into the user interface of the process control and monitoring software. The information regarding the tool's consumption can be communicated to a supervisor computer via a network.

30 Claims, 11 Drawing Sheets

Report: Green Tool overview - [Tool: DEM1]

Start time: 2000-10-01 00:00:00    End time: 2000-11-01 23:59:59

| Channel | Unit | T1: OX11 | T2: LPC1-2 | Σ |
|---|---|---|---|---|
| Ar | SL | 8182.59 | – | 8182.59 |
| DCS | SL | – | 455.40 | 455.40 |
| Exhaust | M^3 | 11309540.24 | 11252595.11 | 22562135.35 |
| H2 | SCC | 8447.01 | – | 8447.01 |
| N2 | SL | 433219.72 | 1876721.98 | 2309941.70 |
| N2 Carousel | SL | 354198.17 | – | 354198.17 |
| N2 Purge | SL | 193544.55 | 6305.37 | 199849.92 |
| N2-Bubbl | SL | 360.59 | – | 360.59 |
| NH3 | SL | – | 0.00 | 0.00 |
| NO | SL | 259.55 | – | 259.55 |
| O2 | SL | 12991.83 | – | 12991.83 |
| PH3/N2 | SCC | – | 1391717.47 | 1391717.47 |
| Power | Kwh | 53.87 | 41.28 | 95.15 |
| SiH4 | SL | – | 0.00 | 0.00 |
| Teos | SL | – | 5613.88 | 5613.88 |
| Water | L | 1945579.87 | 15893389.20 | 3534918.07 |

Exit    Filter    Print    Print Setup    Export

Alarm Tube 2: WHC: BTM Arm: WHR door switch

| Report: Green Tool detail – [Tool: DEM1][Tube1: OXI1] | | | | | | |
|---|---|---|---|---|---|---|
| Start time: 2000-05-29 00:00:00 | | End time: 2000-07-02 23:59:59 | | | | |
| Time Stamp | NO SL | Nr.Carousel SL | Ar SL | N2 Purge SL | Power kWh | N2 SL |
| Wk22 2000-05-29 | 0.00 | 29245.27 | 95.20 | 46078.92 | 2.95 | 8848.69 |
| Wk23 2000-06-05 | 0.00 | 209270.93 | 100.10 | 30542.02 | 7.89 | 97302.21 |
| Wk24 2000-06-12 | 0.00 | 56008.93 | 101.35 | 15117.32 | 25.80 | 62757.88 |
| Wk25 2000-06-19 | 0.00 | 248741.58 | 104.47 | 49076.31 | 6.46 | 96316.30 |
| Wk26 2000-06-26 | 0.00 | 166886.02 | 55.41 | 19722.24 | 3.80 | 52603.92 |
| ∑ | 0.00 | 97334073 | 456.53 | 160536.81 | 31.91 | 407805.00 |

| Sample date: 2000-05-29 | | | | Sample Nr: 1 | | Nr of samples: 5 | |
|---|---|---|---|---|---|---|---|
| Exit | Filter | Channel choice | Print | Print Setup | Export | Mark Block | Unmark Block |

Alarm Tube 2: WHC: BTM Elevator: Timeout

RESOURCE CONSUMPTION CALCULATOR

REFERENCE TO RELATED APPLICATION

This application is a continuation of application Ser. No. 09/893,176, filed Jun. 27, 2001, now U.S. Pat. No. 6,782,343 which claims the priority benefit under 35 U.S.C. §119(e) of provisional Application No. 60/272,393, filed Feb. 28, 2001.

BACKGROUND OF THE INVENTION

1. Field of the Invention

The invention relates to a control, data monitoring and logging system for a process tool.

2. Description of the Related Art

A process tool executes a treatment according to predetermined conditions on material to be treated. Examples are process tools for the treatment of semiconductor wafers, chemical reactors etc. A process tool typically comprises a number of devices like valves, mass flow controllers, a temperature controller providing input signals to a Thyristor Pack or Silicon Controlled Rectifier (SCR), empowering a heating element to be able to control the processing conditions like gas flows, pressure, temperature, etc. A process tool controller controls these devices. For this purpose the controller comprises a number of digital inputs and outputs and a number of analog inputs and outputs. Via the outputs, the various devices are controlled, and via the inputs, information is collected about the actual conditions in the process tool.

In general, process tools have a significant environmental impact because they consume significant amounts of gases, power, cooling water, air extraction, materials etc. For a processing plant it is important to know the total consumption of the plant in order to be able to guarantee a sufficient supply of the utilities. Furthermore, information about the time-average usage of the utilities is important from a cost point of view. And, last but not least, legal regulations increasingly require that the environmental impact of a processing plant be known.

As a first approximation, the time-average consumption of utilities can be calculated based on the specifications of the various tools and assumptions of utilization. However, the actual consumption can deviate substantially from the calculated consumption because either the specification or the assumptions or both can deviate from the actual situation. Therefore, in the art the consumption is measured and monitored.

In the art, the central supply systems for the various utilities are provided with consumption measuring devices and with a monitoring and data logging system so that the consumption on the plant level is known. However, this information is very general and does not provide the possibility of a more detailed analysis of where the utilities are going, which processing tool is consuming more than others, and where in the plant the most important savings could be achieved. For these purposes, information about the consumption of all the individual processing tools would be required. This information can be obtained according to the prior art by providing the utilities supply systems with consumption measuring devices at each individual tap point and monitoring and logging the consumption by a central monitoring and data logging system. However, this would make the utilities supply systems very complicated. It is the object of the present invention to provide means and a method to monitor and report the utility consumption for each tool while omitting the disadvantages outlined above.

SUMMARY OF THE INVENTION

According to one aspect of the present invention, the process tool controller of a processing tool is provided with software that enables collecting, monitoring and logging information regarding the tool's consumption. The data is collected from the devices used for control of process conditions via the analog and digital inputs and outputs of the process tool controller. Consequently, the devices for controlling the process conditions have the additional function of measuring the tool's consumption. In this way the information regarding the tool's consumption is completely collected on board the process tool.

According to another aspect of the invention, the parameters to be monitored and reported can be configured by the user with use of a configuration editor, resulting in optimum flexibility of the system. According to a further aspect of the invention, the user interface of the consumption monitoring and logging software is integrated into the user interface of the process control and monitoring software. According to another aspect of the invention, the information regarding the tool's consumption can be communicated to a supervisor computer via a network.

BRIEF DESCRIPTION OF THE DRAWINGS

The aforementioned and other aspects of the invention will be understood from the description below and the appended drawings. The drawings, which include screen prints from an implemented embodiment of the invention, are meant to illustrate and not to limit the invention.

DETAILED DESCRIPTION OF THE PREFERRED EMBODIMENT

The invention will now be described in further detail below. Environmental impact of human activities is the subject of increasing interest these days. The notion that the earthly resources are finite is increasingly penetrating society and industry. In a first step to control and to reduce the environmental impact of human activities, it is important to quantify this impact and to monitor it. To stimulate this trend, industry has adopted a "Green Tool" label for tools that are provided with means to monitor and log the usage of consumables.

To control the conditions during semiconductor processing, a plurality of devices are present in the process tool for the control of, for example, process gas flow, purge gas flow, electrical power consumption, cooling water flow, air extraction etc. These devices are connected to a process tool controller either directly or indirectly via a sub-controller by means of digital inputs and outputs and analog inputs and outputs. A digital input reflects the state of a digital switch, such as a flow switch that is in an "on" state when the flow is above a certain threshold and in an "off" state when the flow is below the threshold value. A digital output controls the switching, for example, of a valve which is normally closed; the off value of the digital output corresponds to the closed state of the valve and the on value of the digital output corresponds to the open state of the valve. An analog input reflects an actual value of an analog parameter, such as an analog signal from a gas concentration sensor. An analog output reflects a requested setpoint for an analog parameter, such as for a gas flow or a temperature. These inputs and outputs are used to control execution of the process according to the required conditions by means of the process control software.

Figure 1:
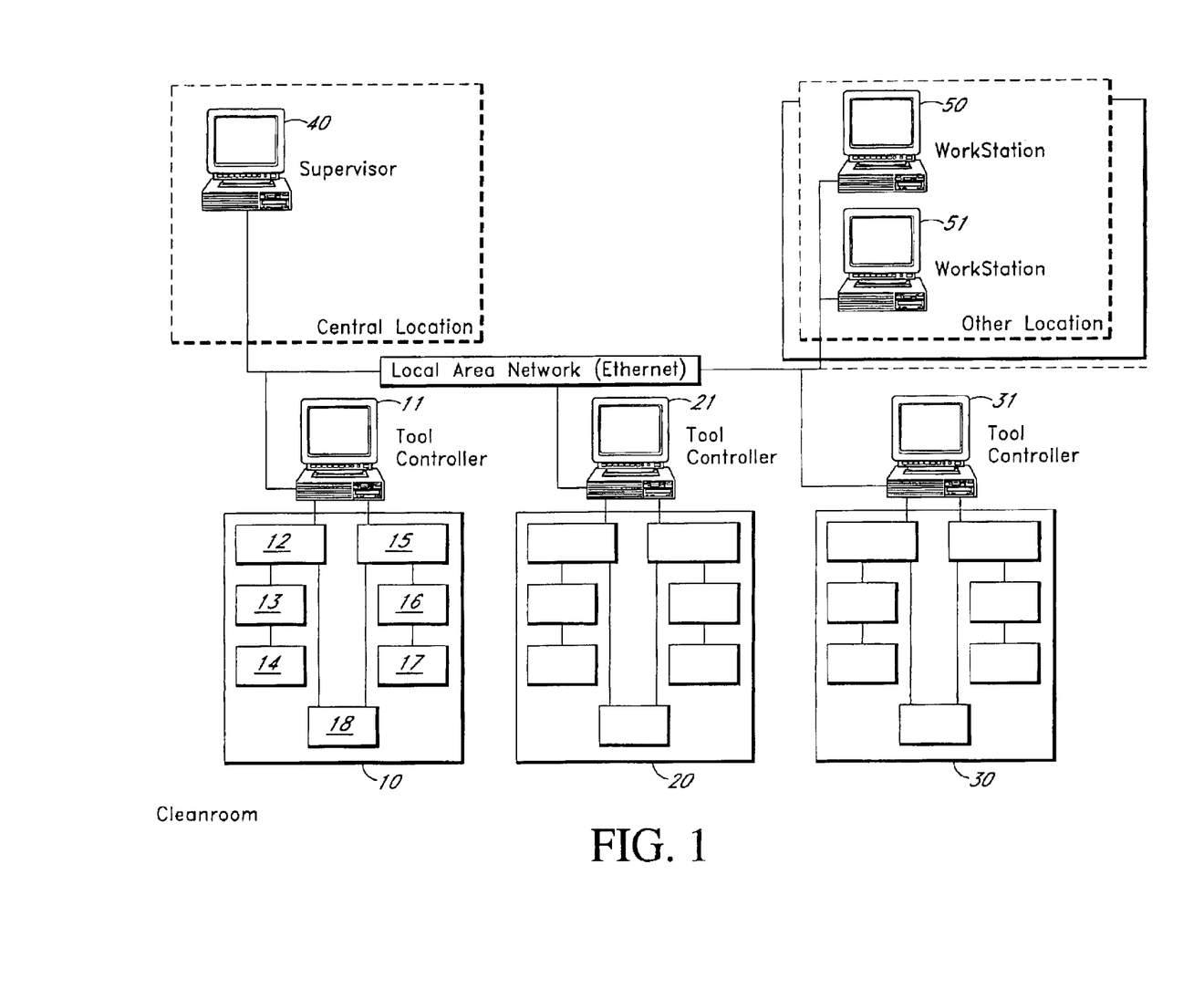
FIG. 1 is a schematic diagram showing an example of a controller hierarchy in a processing plant.

FIG. 1 shows an example of a control structure. Process tools 10, 20 and 30 are each provided with, respectively, process tool controllers 11, 21, and 31. Each process tool may comprise sub-controllers through which the individual control devices are connected to the process tool controller. For tool 10, these sub-controllers are indicated by reference numerals 12–18. The individual process tool controllers are typically connected via a network to a supervisor system 40 or a host computer system. In the network, additional workstations 50, 51 could be provided for monitoring purposes or for editing process "recipes." A process recipe is the software defining the sequence of events and the value of the different process parameters according to which the process tool controller controls the individual process control devices. Preferably, each of the tool controllers, supervisors or work stations is a PC-type computer, provided with a screen display and, for human control purposes, with a keyboard, a touch screen, a lightpen or the like. A printer can be connected to each computer.

In each tool a lot of information is already available for process control purposes. In the preferred embodiment, this information is utilized to monitor and log the usage of consumables in the tool. Therefore, a process tool is provided with a computer program, residing in the working memory of the process tool controller, which program collects information about the actual consumption via the inputs and outputs of the process tool controller. According to a further aspect of the invention, the parameters to be monitored and reported can be configured by the user, with use of a "Green Tool" configuration editor, resulting in optimum flexibility of the system. In a preferred embodiment, the user interface of the Green Tool software for monitoring and reporting information about consumables is integrated in the user interface of the process control and monitoring software. In an alternative embodiment, these respective user interfaces are not integrated.

The Green Tool software works as follows. First, the parameters to be monitored are defined and configured by the Green Tool configuration editor. During the operation of the tool, the value of these parameters is sampled at a high frequency, preferably at least as frequently as about every 10 seconds, more preferably at least about once every second, and these values are stored, preferably in a short-term or volatile memory. At a low frequency, preferably no more frequently than once about every 10 minutes and more preferably less frequently than or equal to about once per hour, the sum of these sampled values is calculated and this sum value is stored, together with a time stamp, on the hard disc of the process control computer for an indefinite time. The high frequency sampling is reset, and the old values of the high frequency sampling are not kept in storage any longer. In this way a strong data reduction is achieved, whereas for the purpose of monitoring and logging the consumption, there is practically no loss of relevant information. The low frequency sampling results only in the loss of time resolution of the historic data, but the value of the cumulative consumption is still accurate. Preferably, the low frequency summing reduces data storage needs by a factor of at least 100, more preferably by a factor of over 1000; in the illustrated embodiment, storage needs are reduced by 3600 times. At the same time, the measurement technique is such that the sums reflect data taken with a much higher resolution.

Figure 2:
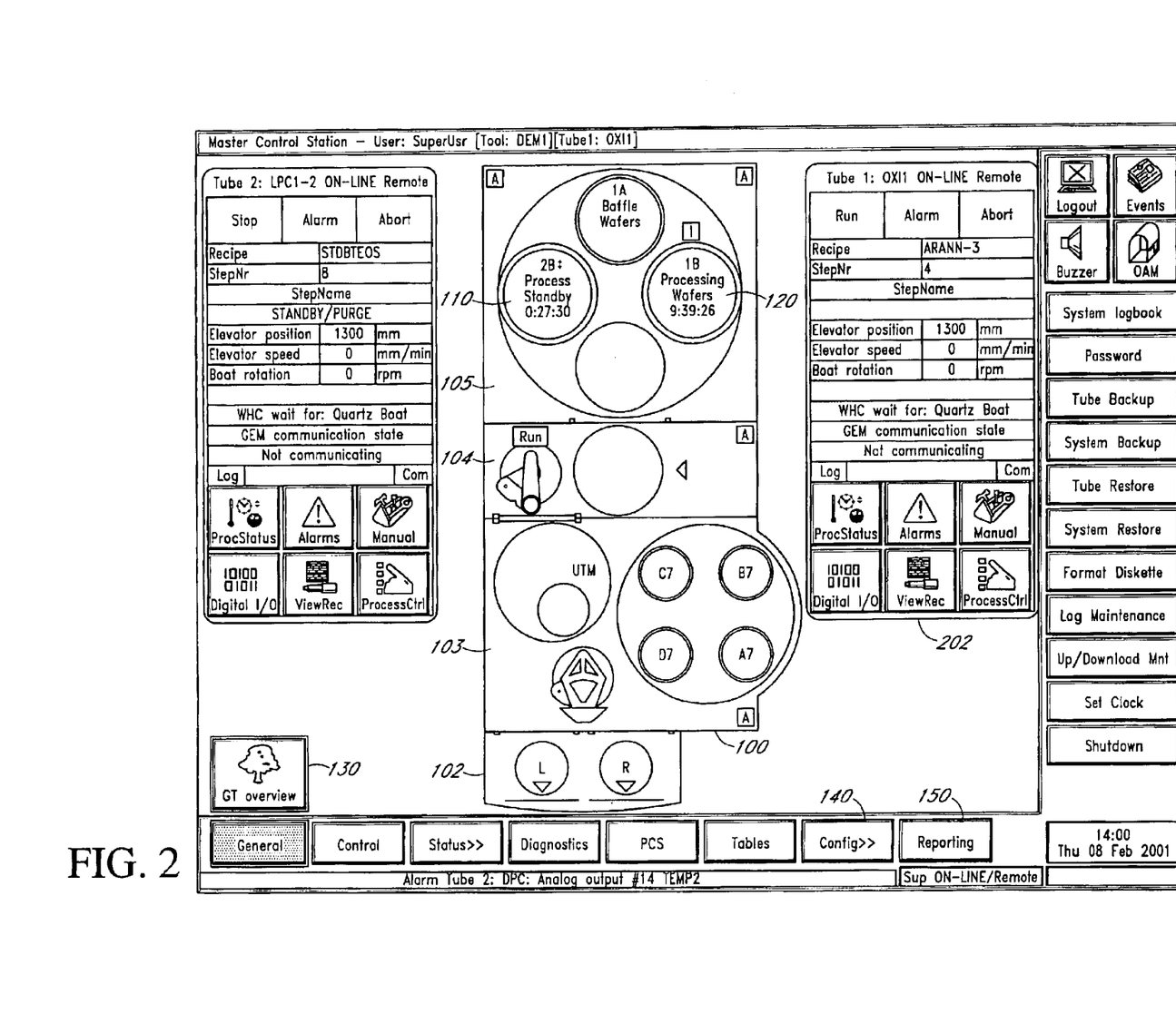
FIG. 2 shows the main screen of control software with a "Green Tool" overview button, in accordance with a preferred embodiment of the invention.

An embodiment of the invention will be explained in further detail with reference to the figures. FIG. 2 shows the main screen of the process control and monitoring software. In the center of the screen, a graphical presentation is given of a tool 100 for the processing of semiconductor wafers. The wafers, stored in cassettes, are supplied on an input/output station 102, behind which a cassette transfer and storage area 103 is present. Area 104 represents the wafer transfer area, where wafers are transferred from the cassettes into wafer boats, and area 105 represents the processing area where the wafers are processed while residing in the wafer boats. The illustrated processing area 105 comprises two process reactors or process tubes, 110 and 120. At both sides of the graphical representation are user interfaces 201 and 202 for each of the process reactors 110 and 120, respectively. A "Green Tool" overview button is indicated by reference numeral 130. Pressing this button 130 activates a time window screen similar to the one shown in FIG. 9 but with the resolution section disabled, as will be understood from the description below.

Figure 3:
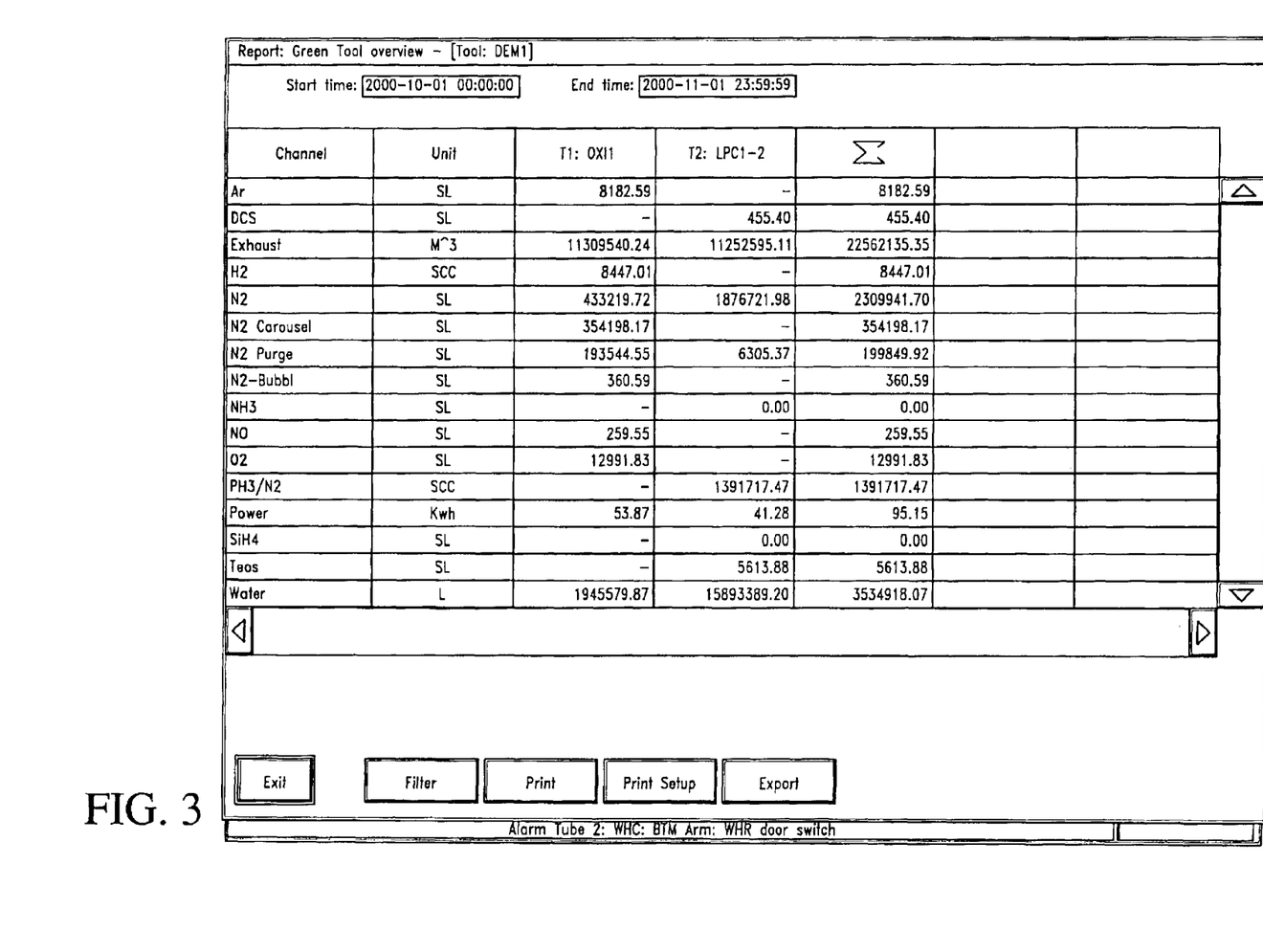
FIG. 3 shows a Green Tool overview screen for the software of FIG. 2.

After defining the time window and pressing the OK button, the Green Tool overview screen as shown in FIG. 3 is displayed. This screen shows the cumulative consumption for all the configured consumables, for each process tube separately as well as for both tubes combined. Pressing the exit button takes the user back to the main screen of FIG. 2.

Figure 4:
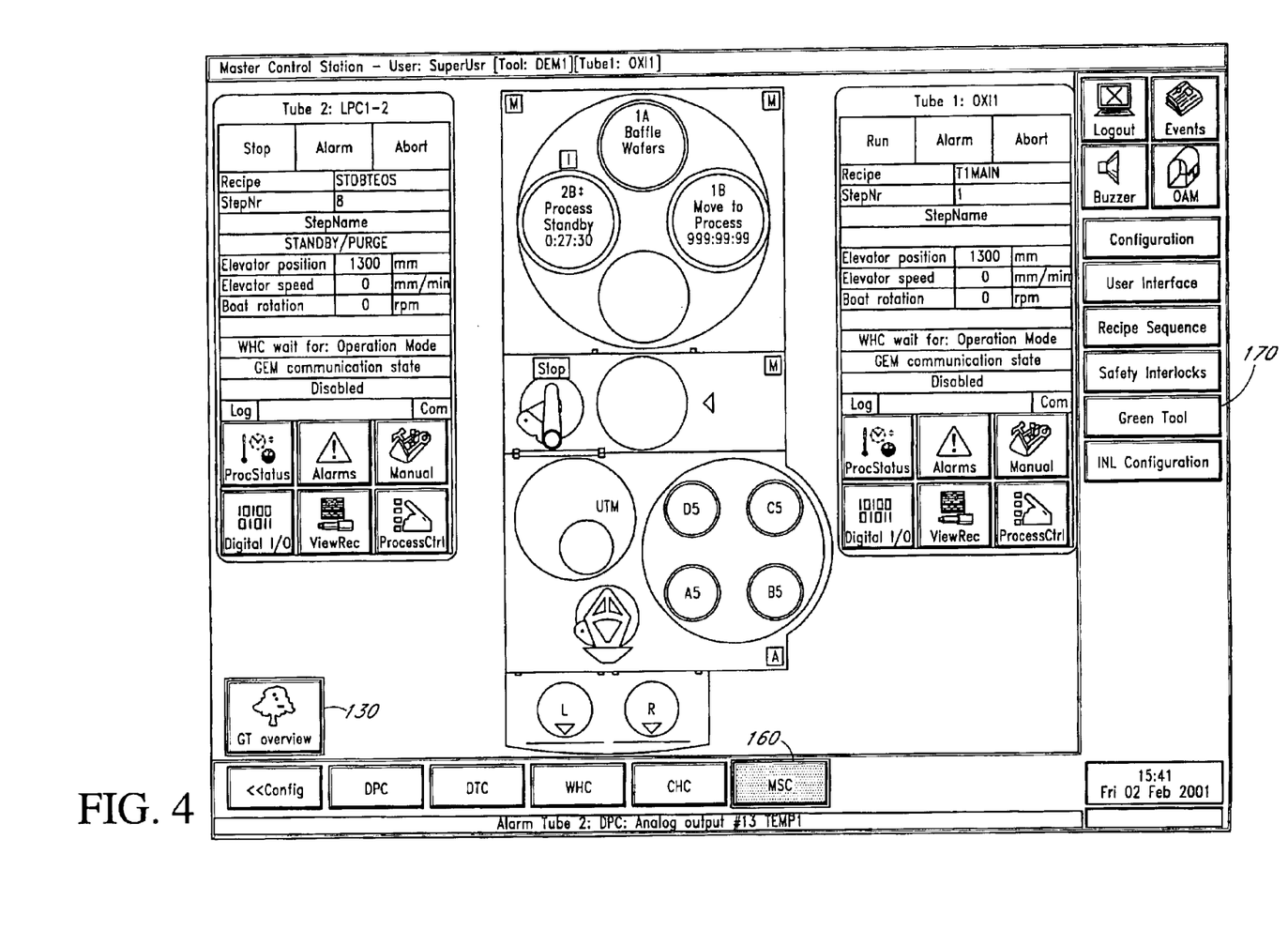
FIG. 4 shows the route from the main screen to the Green Tool configuration editor for the software of FIG. 2.
Figure 5:
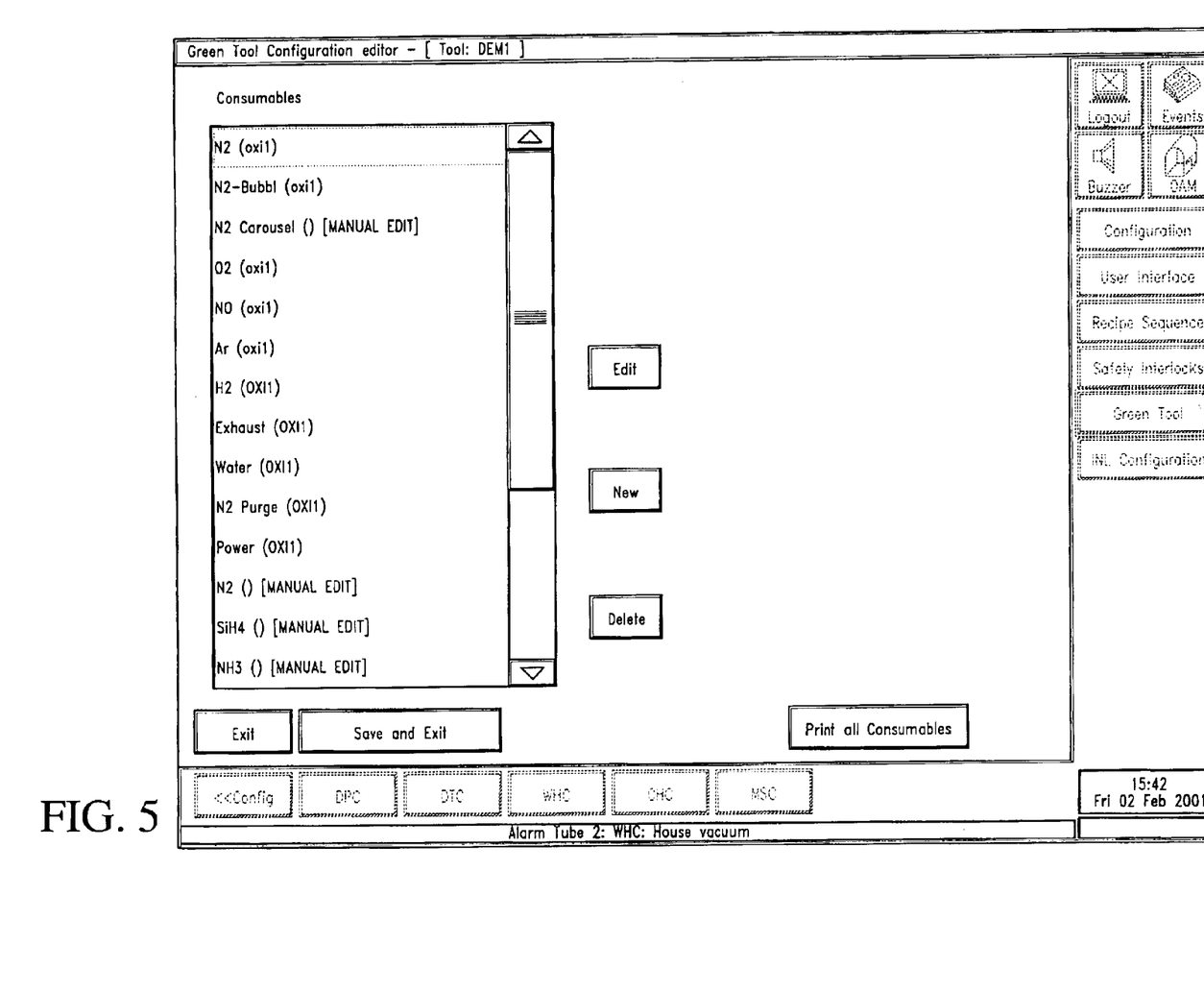
FIG. 5 shows the first screen of the Green tool configuration editor for the software of FIG. 2.

From FIG. 2, when the Config button 140 is pressed, the screen as shown in FIG. 4 is displayed. From this screen, pressing the MSC button 160 causes the column of buttons at the right side to appear, and when the Green Tool button 170 is pressed the Green Tool configuration editor screen as shown by FIG. 5 is displayed. From this Green Tool configuration editor the parameters to be monitored can be configured.

Figure 6:
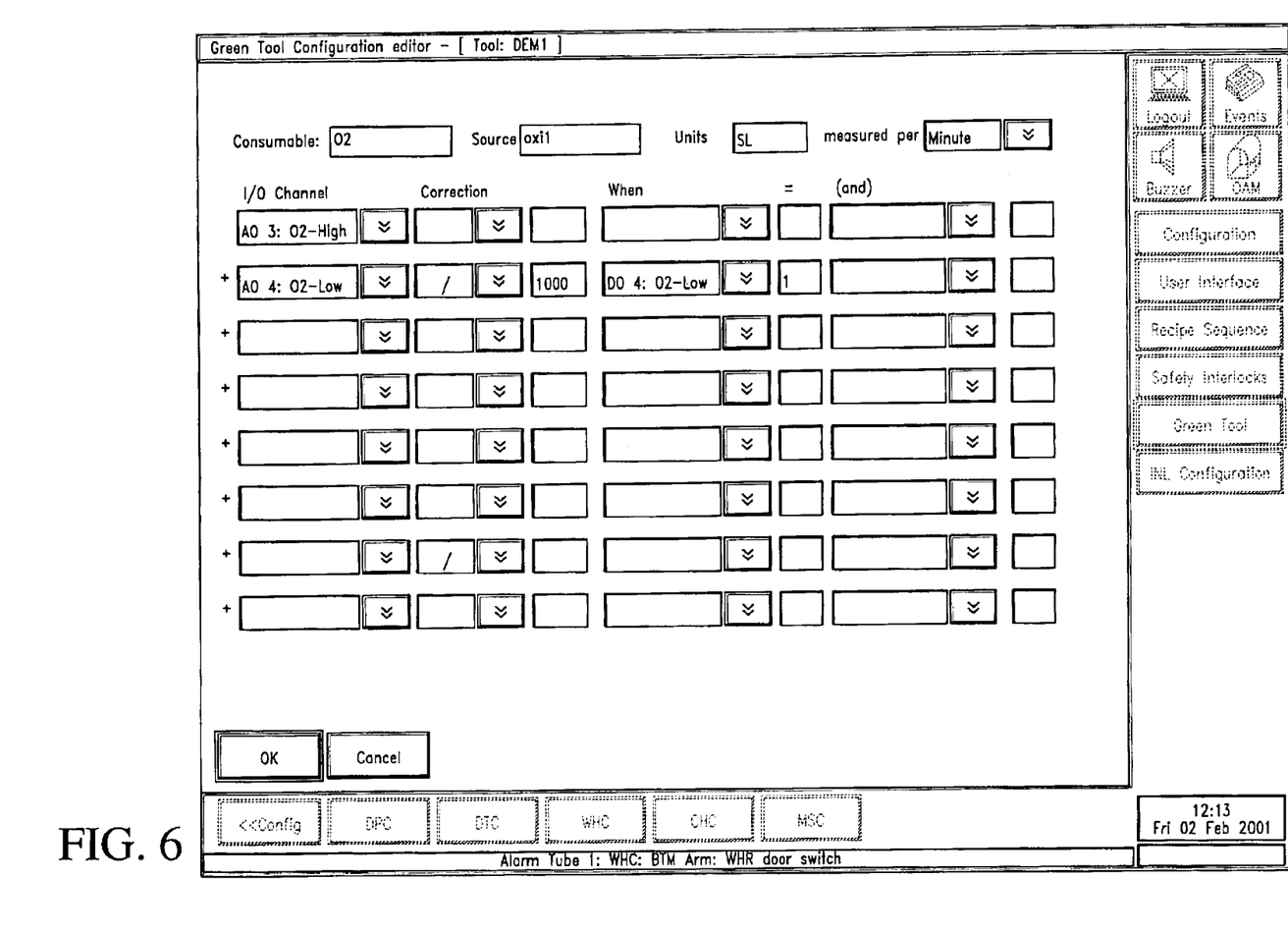
FIG. 6 shows the editing screen for the consumable "O2" for the software of FIG. 2.
Figure 7:
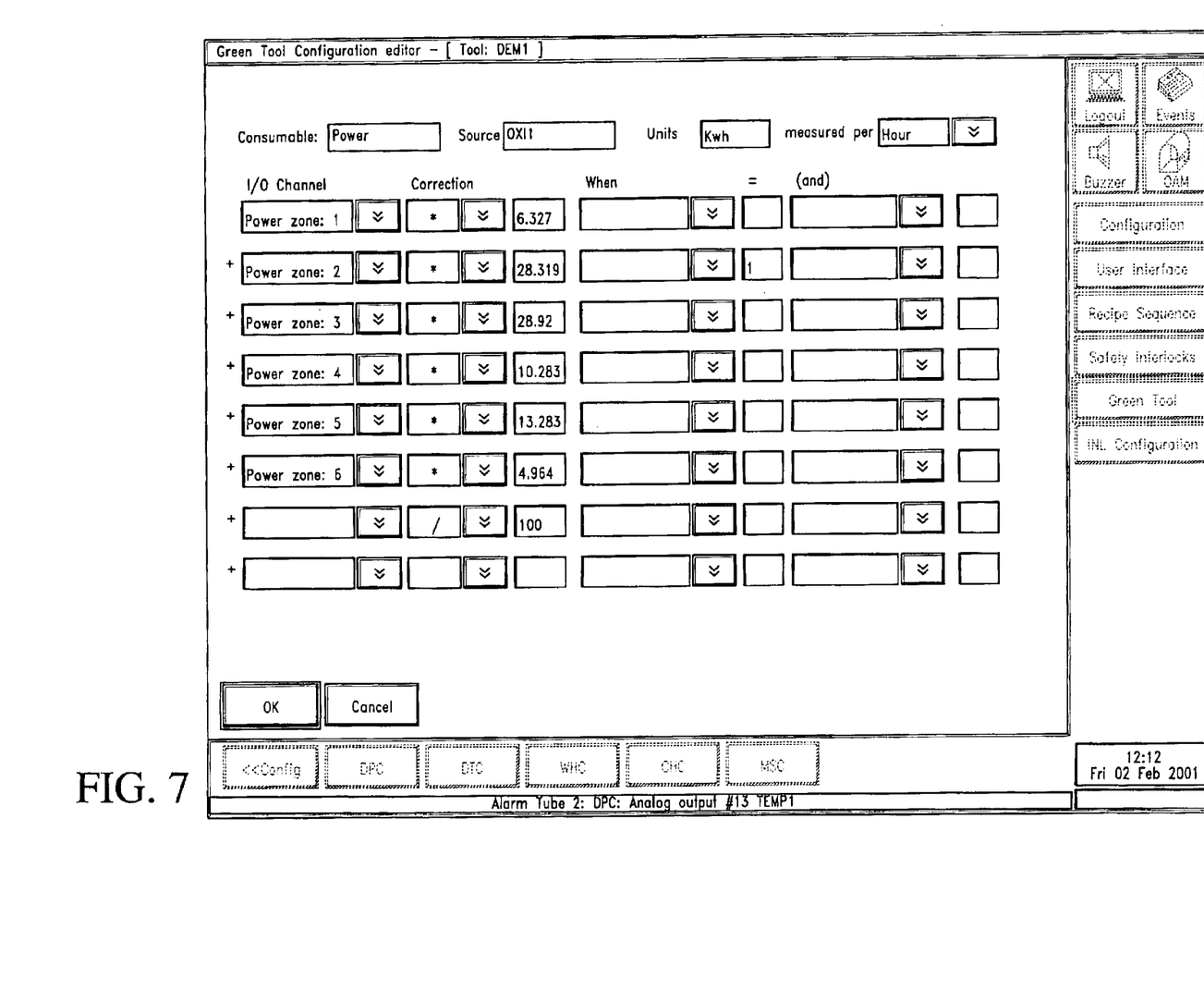
FIG. 7 shows the editing screen for the consumable "Power" for the software of FIG. 2.

Two examples of configured parameters are given in FIGS. 6 and 7. In FIG. 6 the consumable O2 is configured. It can be observed that two O2 flows are combined into this O2 consumable. It is also possible to apply a correction factor, such as when one mass flow controller reads in Standard Liter per Minute (SLM) and the other in Standard Cubic Centimeter per Minute (SCCM). Additionally, it is possible to set a condition during which the consumable resource should be monitored. In this example, the O2 low flow is only monitored when the Digital Output "O2-low" is ON. This eliminates errors due to small offsets of the mass flow controller, which, when integrated over a long period of time, can give rise to erroneous results. Although "AO"

(analog output) is indicated in the leftmost column, the software of the present embodiment is configured such that "AO" indicates a combination of an analog output and an analog input. Such a combination is used with a mass flow controller, where AO indicates the setpoint and the corresponding AI is the actual value of the MFC fed back into the tool controller.

In FIG. 7 the example of "Power" is given. The heating elements of the process tubes comprise six zones. The most important power consumption is due to the heating element. As compared to the heating element, the power consumption of other devices in the tool is insignificant. Unfortunately, the power consumed by the element is not actually measured by the process controller. Instead of installing power meters in the tool, which is one solution to generate information, the preferred embodiment employs another solution. Signals that are available in the tool are the control signals of the temperature controller, which control signals are fed into the Thyristor Pack or Silicon Controlled Rectifier (SCR) unit for controlling the power applied by the SCR unit to the heating element. These signals, ranging from 0 to 100%, are taken as inputs for monitoring the power consumption. From the design of the element it is known what 100% means and a corresponding calibration factor is applied to each power zone. Although aging might occur during the life time of the element, and the actual power might drift away a little bit from the calibrated value, the above-described approach gives a very good approximation of the power consumption without adding additional components to the system.

The possibilities of the configuration editor, to define consumables and conditions as represented by the screens, are limited. However, the possibilities for defining consumables are not limited to the possibilities facilitated by the available screens. The configuration editor generates an ASCII file with formulas in RPN (Reverse Polish Notation) format. The formula in this ASCII file may be edited using an ordinary text editor. In this way more complex formulas can be defined, such as dividing two analog parameters or multiplication of two analog parameters, taking the square root of a parameter or other mathematical operations. Such more complex formulas would, of course, also be reflected in newly designed screens.

Figure 8:
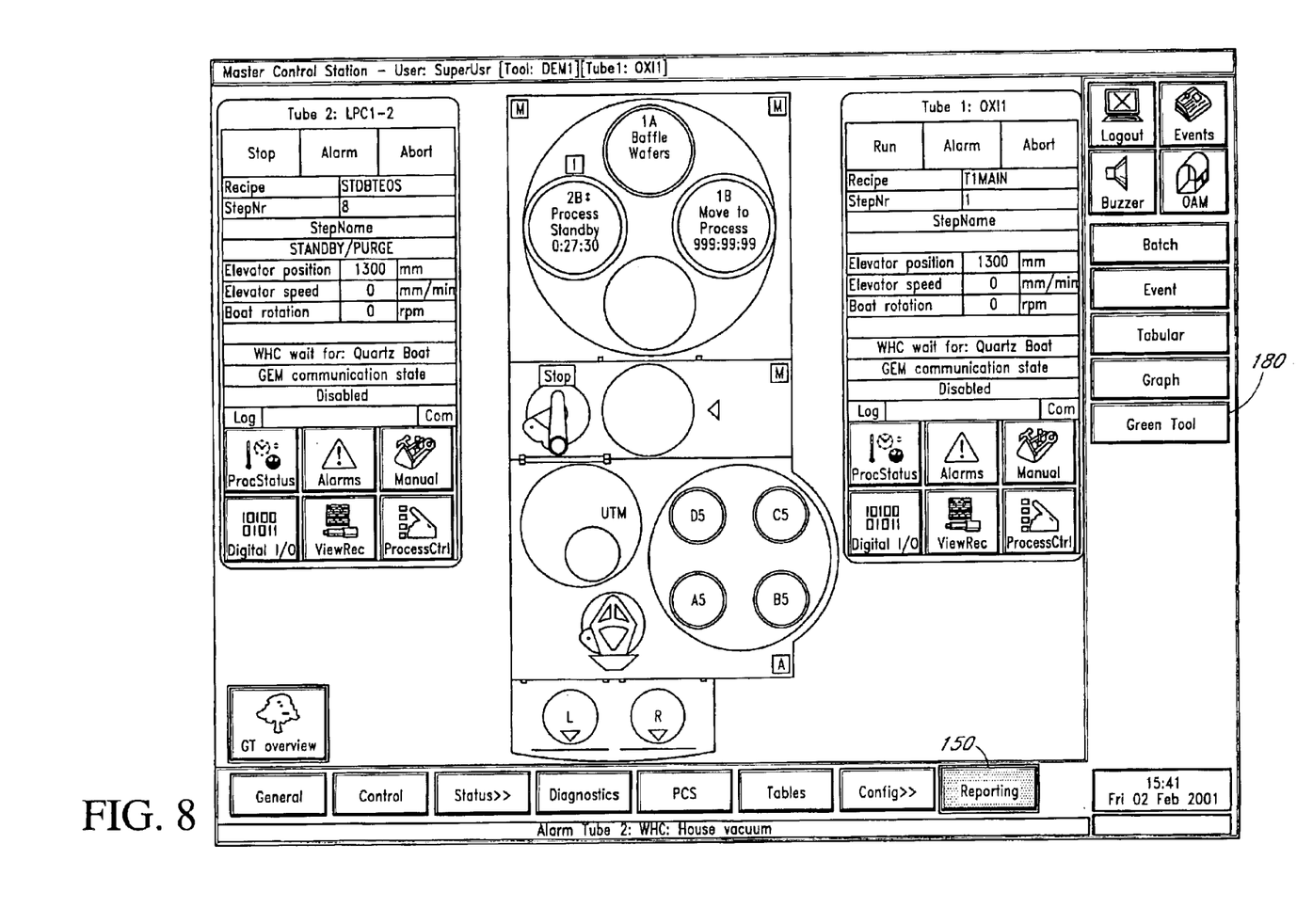
FIG. 8 shows the route from the main screen to the Green Tool detailed report for the software of FIG. 2.
Figure 10:
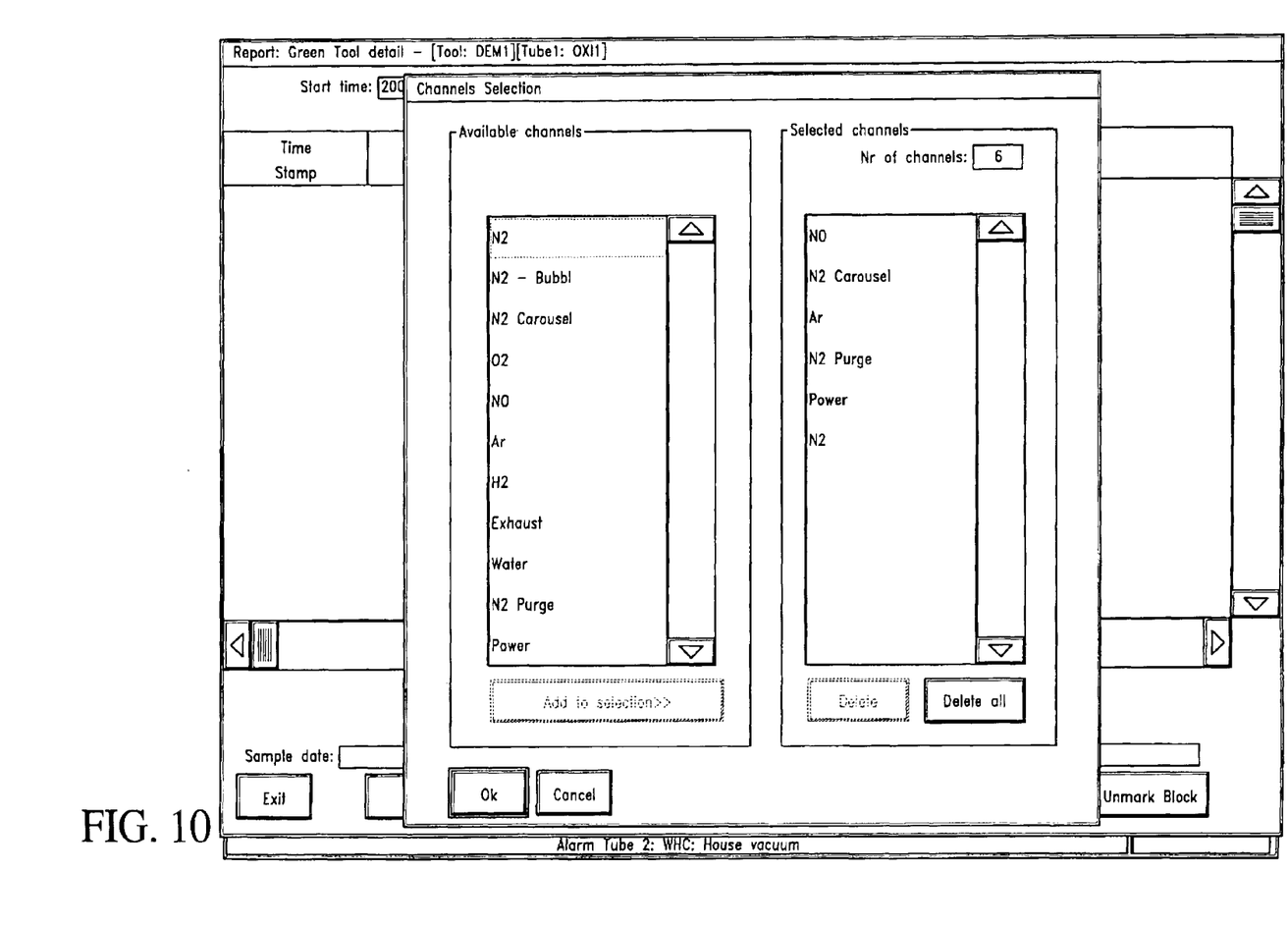
FIG. 10 shows the screen where the parameters to be reported are selected for the software of FIG. 2.
Figure 11:
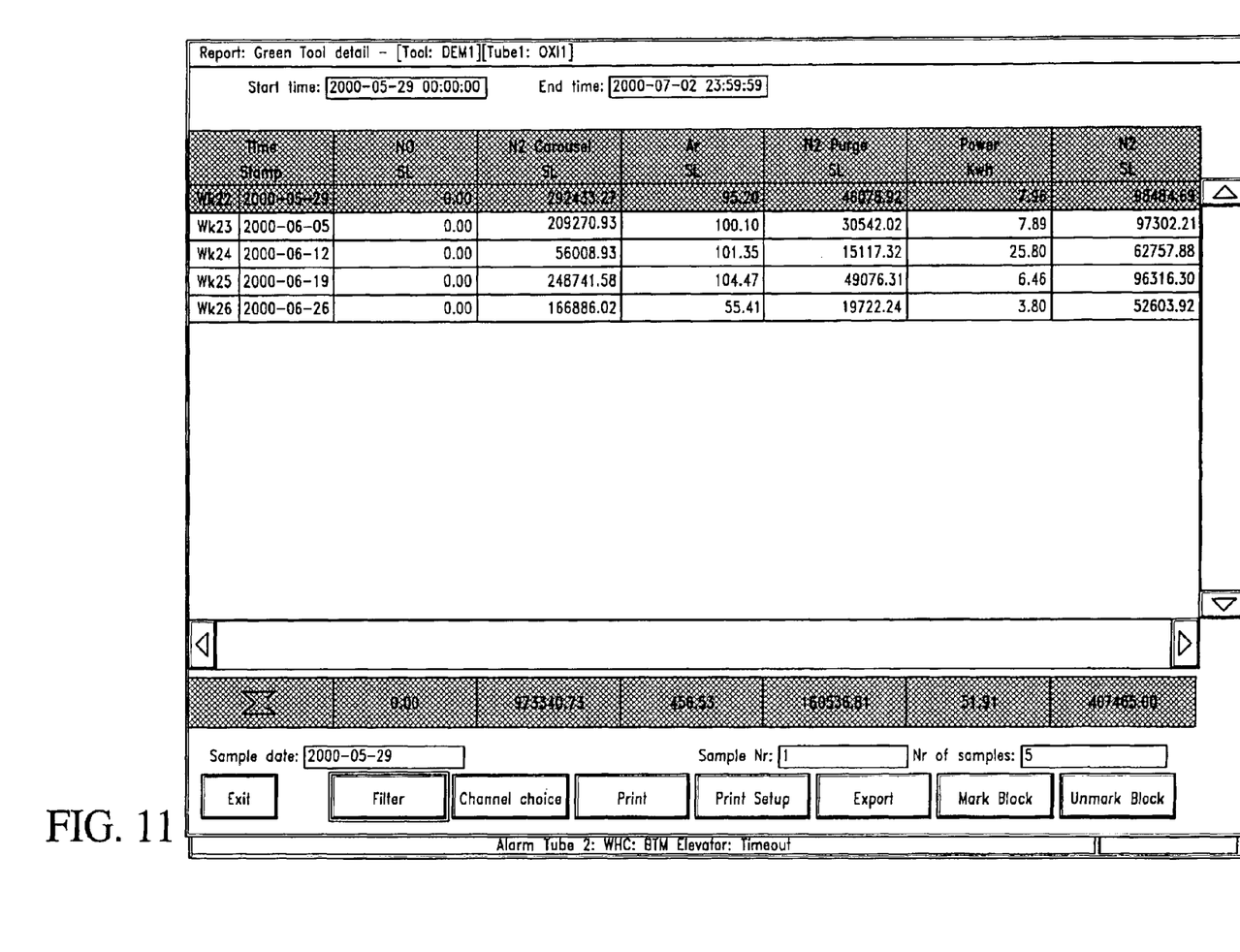
FIG. 11 shows a detailed report according to the parameters selected for the software of FIG. 2.

When the reporting button 150 is pressed in the main screen of FIG. 2, the screen as presented in FIG. 8 is displayed. This route can be followed when a report more detailed than the overview report is desired. When the Green Tool button 180 is pressed in the screen of FIG. 8, the report generator screens of FIGS. 9–11 are displayed.

Figure 9:
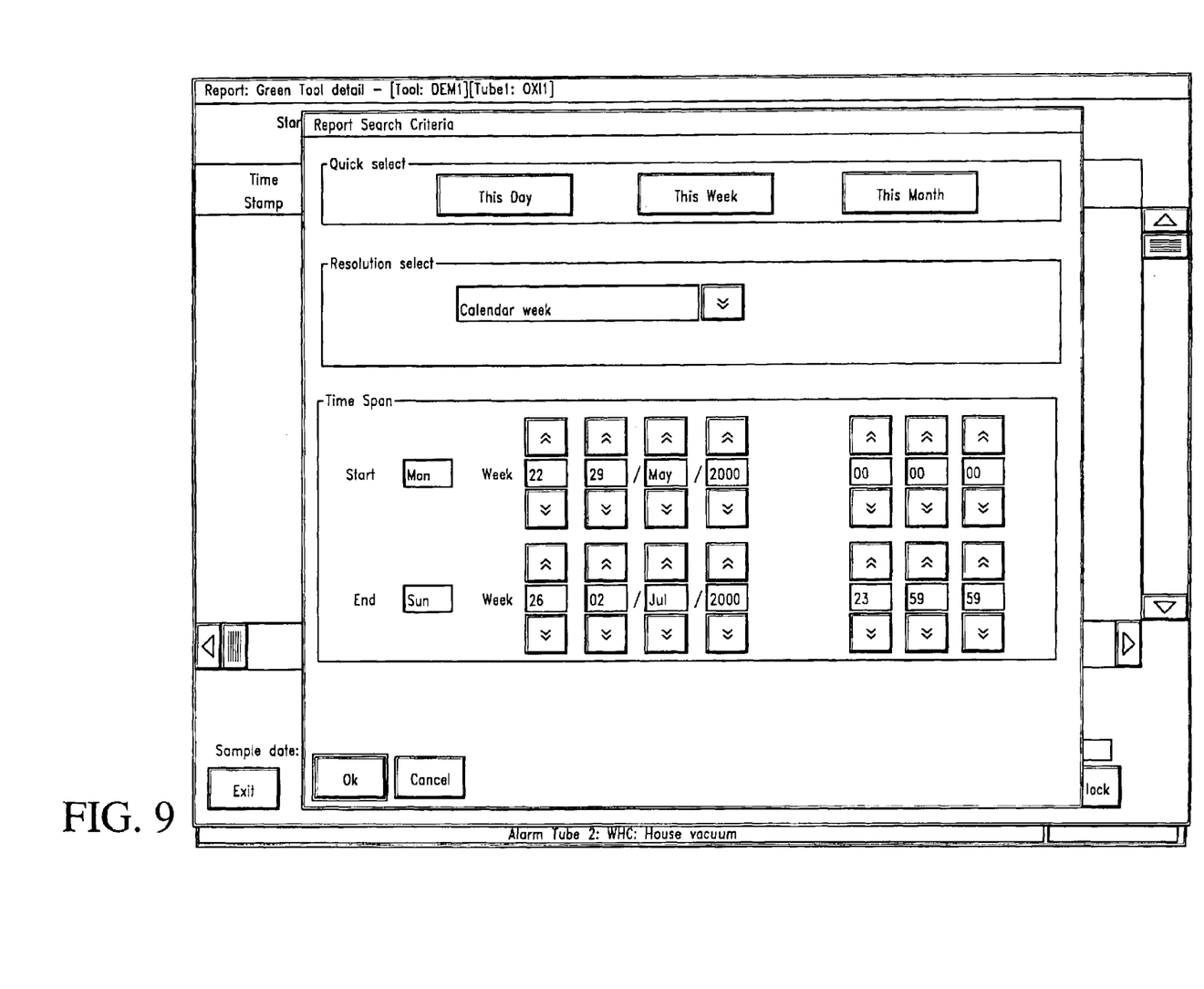
FIG. 9 shows the screen where the time span for the detailed report is selected for the software of FIG. 2.

FIG. 9 shows the screen where the time span and time resolution for the reporting can be set. As shown, a number of "quick select" options are provided with present time span and resolution, as well as individual options to more precisely set the time period and resolution of interest for a tailored report. In the screen shown in FIG. 10, the parameters or channels to be reported can be selected. "Available channels" represents the previously user-defined parameters that are being monitored by the software for resource consumption. The user can select among these monitored channels ("selected channels") for purposes of his desired report. In FIG. 10, ten channels are shown (if there are more, the user can scroll down to view them) that have been previously user-defined for monitoring, while the user has selected six of these channels for generating the report. FIG. 11 shows an example of a detailed Green Tool report, showing five intervals (selected resolution is weekly) for these five selected channels.

Advantageously, the system described herein makes use of existing process control features in a semiconductor processing tool to obtain information on resource consumption. Thus, the system can be employed on existing tools by simply installing new software, without the expense and tool downtime of retrofitting tools with separate monitoring hardware. The system is furthermore highly flexible, allowing the user to configure the software to monitor consumption of various resources for various process recipes.

Although this invention has been described on the basis of preferred embodiments, modifications of the invention are possible within the spirit and scope of this disclosure. This application is intended to cover modifications, adaptations or variations of the invention which make use of its general principles. Furthermore, the invention was described in the context of semiconductor manufacturing processes, but those of skill in the art will recognize that it may be adapted for use in various industries; for example, adaptation and use in chemical production or the like is possible.

I claim:

1. A system for monitoring resource consumption by semiconductor fabrication processes, comprising:
    at least one semiconductor process tool comprising at least one process-control device for controlling at least one process condition within the process tool;
    at least one tool controller communicating with the at least one process-control device according to a process recipe for treating workpieces within the process tool; and
    computer software residing in a memory of the tool controller, the computer software configured to sample values of a parameter from the at least one process-control device, wherein the sampled values reflect actual resource consumption of a consumable at the points in time that the values are sampled, and configured to sum the sampled values of the parameter taken over a period of time so as to obtain a value of a cumulative resource consumption of the consumable over the period of time and configured to store the values of the cumulative resource consumption.

2. The system of claim 1, wherein the at least one process-control device includes at least one heating element and at least one mass flow controller.

3. The system of claim 2, wherein the sampled values of the parameter comprise power output to the at least one heating element and gas flow through the at least one mass flow controller.

4. The system of claim 1, wherein the sampled values of the parameter comprise inputs originating from the at least one process-control device and fed back into the at least one tool controller.

5. The system of claim 4, wherein the sampled values of the parameter comprise outputs from the tool controller to the at least one process-control device.

6. The system of claim 1, wherein the parameter is user-defined and the computer software comprises an editor configured to select the user-defined parameter.

7. The system of claim 6, wherein the user-defined parameter is a parameter reported to the process tool controller by the at least one process-control device.

8. The system of claim 7, wherein the user-defined parameters include a parameter selected from the group consisting of process gas flows, purge gas flows, electrical power consumption, and cooling water flows.

9. The system of claim 7, wherein the values of the parameter reported to the process tool controller is sampled at a high frequency and the values of the parameter is summed at a low frequency.

10. The system of claim 9, wherein a rate of the high-frequency sampling is user-controlled at the editor.

11. The system of claim 9, wherein a frequency ratio of parameter value sampling to data summing is greater than about 100.

12. The system of claim 11, wherein a frequency ratio of parameter value sampling to data summing is greater than about 1000.

13. The system of claim 1, wherein the computer software comprises a report generator configured to generate resource consumption reports relating to user-selected ones of parameters being sampled for consumption of resources.

14. The system of claim 13, wherein the report generator allows user selection of a report time span.

15. The system of claim 14, wherein the report generator allows user selection of a report time resolution, wherein the report time resolution establishes a time interval represented by parameter values displayed in the report.

16. The system of claim 13, wherein the resource consumption reports contain cumulative resource consumption values and process recipe details.

17. The system of claim 13, wherein the resource consumption reports contain cumulative resource consumption values.

18. The system of claim 1, wherein a user interface of the computer software is integrated into a user interface of the tool controller.

19. A method of determining resource consumption on a semiconductor process tool, the method comprising:
   monitoring electronic inputs and outputs controlling a semiconductor process recipe; and
   calculating cumulative resource consumption from the inputs and/or outputs, wherein calculating comprises computing a total resource consumption over a time interval,
   wherein monitoring and calculating are performed on the semiconductor process tool.

20. The method of claim 19, wherein the inputs and outputs include analog signals.

21. The method of claim 20, wherein the inputs and outputs include digital signals.

22. The method of claim 19, wherein calculating comprises summing resource consumption data derived from the inputs and outputs.

23. The method of claim 19, wherein calculating comprises summing resource consumption data derived from the outputs.

24. The method of claim 23, wherein calculating comprises applying a calibration factor to the outputs to arrive at the resource consumption data.

25. The method of claim 19, wherein calculating comprises determining a total resource consumption for each of a plurality of successive time intervals.

26. The method of claim 25, wherein the time intervals have a duration of about one hour or less.

27. The method of claim 25, wherein monitoring comprises sampling the inputs and outputs multiple times per time interval.

28. The method of claim 27, wherein monitoring comprises storing the sampled inputs and outputs in short-term memory and wherein calculating comprises storing the total resource consumption for each of the plurality of successive time intervals in long-term memory.

29. The method of claim 28, wherein calculating comprises erasing the sampled inputs and outputs for each time interval after determining the total resource consumption for that time interval.

30. The method of claim 19, further comprising generating a resource consumption report containing cumulative resource consumption values.

* * * * *